(12) United States Patent
Hekstra et al.

(10) Patent No.: US 7,185,263 B2
(45) Date of Patent: Feb. 27, 2007

(54) METHOD OF JOINT DECODING OF POSSIBLY MUTILATED CODE WORDS

(75) Inventors: Andries Pieter Hekstra, Eindhoven (NL); Constant Paul Marie Jozef Baggen, Eindhoven (NL); Ludovicus Marinus Gerardus Maria Tolhuizen, Eindhoven (NL)

(73) Assignee: Koninklijke Philip Electronics N. V., Eindhoven (NL)

( * ) Notice: Subject to any disclaimer, the term of this patent is extended or adjusted under 35 U.S.C. 154(b) by 62 days.

(21) Appl. No.: 10/506,375

(22) PCT Filed: Feb. 14, 2003

(86) PCT No.: PCT/IB03/00583

§ 371 (c)(1),
(2), (4) Date: Sep. 2, 2004

(87) PCT Pub. No.: WO03/077247

PCT Pub. Date: Sep. 18, 2003

(65) Prior Publication Data

US 2005/0108616 A1    May 19, 2005

(30) Foreign Application Priority Data

Mar. 8, 2002 (EP) .................................. 02075914

(51) Int. Cl.
*H03M 13/00* (2006.01)

(52) U.S. Cl. .................. 714/758; 714/780; 714/797
(58) Field of Classification Search ................ 714/759, 714/760, 780, 758, 797
See application file for complete search history.

(56) References Cited

U.S. PATENT DOCUMENTS

| 4,951,284 | A | * | 8/1990 | Abdel-Ghaffar et al. ..... 714/761 |
| 5,949,796 | A | * | 9/1999 | Kumar ........................ 370/529 |
| 6,246,698 | B1 | * | 6/2001 | Kumar ........................ 370/487 |
| 6,289,000 | B1 | * | 9/2001 | Yonge, III ................... 370/203 |
| 2003/0066014 | A1 | | 4/2003 | van Dijk et al. |
| 2003/0095056 | A1 | | 5/2003 | Tolhuizen et al. |

* cited by examiner

*Primary Examiner*—Albert Decady
*Assistant Examiner*—Mujtaba Chaudry

(57) ABSTRACT

A method of decoding possibly mutilated code words (r) of a code (C) includes decoding the differences (D) of a number (L−1) of pairs of possibly mutilated code words ($r_{ib}$, $r_{i+1}$) to obtain estimates (u, v) for the differences of the corresponding pairs of code words ($c_i$, $c_{i+1}$), combining the estimates (u, v) to obtain a number (L) of at least two corrupted versions ($w_j$) of a particular code word (c), forming a code vector (z) from the number (L) of corrupted versions ($w_j$) of the particular code word (c) in each coordinate, decoding the code vector (z) to a decoded code word (c') in the code (C), and using the generator matrix (G) to obtain the information word (m) and the address word (a) embedded in the decoded code word (c').

12 Claims, 2 Drawing Sheets

METHOD OF JOINT DECODING OF POSSIBLY MUTILATED CODE WORDS

BACKGROUND OF THE INVENTION

1. Field of the Invention

The invention relates to a method of decoding possibly mutilated code words of a code, wherein an information word and an address word are encoded into a code word of said code using a generator matrix, and wherein said address words are selected such that address words having a known relationship are assigned to consecutive code words. The invention relates further to a corresponding apparatus for decoding possibly mutilated code words and to a computer program for implementing said method.

2. Description of the Related Art

In European Patent Application No. 01201841.2, corresponding to U.S. Patent Application Publication No. 2003/0066014-A1 (PHNL 010331), the concept of coding for informed decoding is described. An enhancement can be found in European Patent Application No. 01203147.2, corresponding to U.S. Patent Application Publication No. 2003/0095056-A1 (PHNL 010600). The key element of the inventions described in these applications is an appropriate selection of the mapping of information strings towards code words from the Error Correcting Code (ECC) that is applied. The aim of coding for informed decoders is to enable more reliable information retrieval if the decoder a priori knows part of the encoded information. A typical example is in the field of address retrieval of optical media. In case of a forced jump to a certain sector, part of the address of the sector in which the read/write head will land is known taking the jump accuracy into account. For instance, in DVR (Digital Video Recording), it is anticipated that on the spiral track on the optical disc, a series of messages is encoded which aids in the logical positioning of the read/write head above the disc, which, e.g., contains copyright information, date information and a logical track counter. Of this information, only the logical track counter changes in between successive messages. Therefore, a priori known information can be available from successful decoding of previous messages.

According to the solutions described in the above-mentioned patent applications, decoding of a second message can only gain from the decoding of the first message, if said first decoding is successful. A second decoding can then, in turn, aid in the decoding of the third message, and so on. However, if the decoding of the first message fails, the fact that the second message has been encoded in a special way does not improve the error correcting capabilities, i.e., the second and any further decoding is not helped by previous decodings. All decodings could then fail. In other situations, for example, at the very start of a recording or playback session, not much is known about the actual landing place of the read/write head. In that case, only the error correcting capabilities of the code can be used for retrieving information.

SUMMARY OF THE INVENTION

It is therefore an object of the present invention to provide an improved method and apparatus of decoding possibly mutilated code words which can be used if the error correcting capabilities of the code are insufficient to allow reliable information retrieval, and which can also be used if there are so many errors that, despite application of informed decoding as described in the above mentioned patent applications, these errors can not be corrected.

This object is achieved, according to the present invention, by a method of decoding as claimed in claim 1, comprising the steps of:

decoding the differences of a number of pairs of possibly mutilated code words to obtain estimates for the differences of the corresponding pairs of code words, combining said estimates to obtain a number of at least two corrupted versions of a particular code word, forming a code vector from said number of corrupted versions of said particular code word in each coordinate, decoding said code vector to a decoded code word in said code, and using said generator matrix to obtain the information word and the address word embedded in said decoded code word.

The present invention is based on the idea to employ certain relationships between consecutive code words and to jointly decode several such consecutive code words. "Consecutive" code words in this context shall mean code words which are read and/or inputted into the decoder subsequently, e.g., code words which are located in series next to each other in a data stream, or which are stored in consecutive sectors on an information carrier, such as a CD, DVD or DVR or magnetic disc.

The proposed method of joint decoding comprises two main elements. A first main element comprises the step of obtaining estimates for the differences of various pairs of consecutive code words by decoding the differences of their corrupted versions. According to a second main element, the decoding results of said differences of corrupted pairs of consecutive code words are combined resulting in a number of corrupted versions of one and the same code word. These corrupted versions then are all used for obtaining the desired code word from which, finally, the information word and the address word can be retrieved. Since the address words encoded in the code words have a certain known relationship, much can be said during decoding about the difference of possibly mutilated code words which knowledge is advantageously used according to the invention during decoding.

Preferably, said code vector is formed by majority voting in each coordinate from the number of corrupted versions obtained from the estimates. If more than one value occurs most frequent among said number of corrected versions, the corresponding coordinate of said code vector is erased according to a further preferred embodiment. Alternatively or in addition, reliability information available on the symbols of one or more possibly mutilated code words is used for selecting the coordinates of said code vector according to still another preferred embodiment. Reliability information could be information about the probability that a certain value is correct. If available, it is preferred to include reliability information for each of the bits of the code vector for enhancing its decoding.

A preferred way of obtaining an estimate for the difference of a pair of code words is to decode the difference of the corresponding pair of possibly mutilated code words to the closest code word from a subcode consisting of all possible differences of two consecutive code words of the main code which closest code word is then used as said estimate.

The probability of incorrect decoding can be further reduced by introducing an extra check according to which the obtained estimates are checked if they show a predetermined form and/or have a possible value. Preferably, if this check fails, the decoding result should be rejected.

The present invention is advantageously used for decoding of code words stored on an information carrier, such as an optical or magnetic disc. According to standards used for optical recording, such as the CD-DA or the DVR standard, address words assigned to consecutive code words are consecutive, e.g., are subsequently increased by one, and preferably represent the sector address of the sector in which the corresponding code word is stored. Said relationship between the address words assigned to consecutive code words will be exploited by the present invention.

For reducing decoding delay, it is advantageous if the number of pairs of possibly mutilated code words to be decoded is as small as possible. However, at least two pairs of two consecutive possibly mutilated code words have to be decoded so that at least three estimates can be obtained, since particularly majority voting on two alternatives is not useful. If reliability information is used instead of majority voting, one pair might be sufficient.

According to another aspect of the present invention, it is proposed that in said step of combining said estimates to obtain a number of corrupted versions of a particular code word, a first corrupted version corresponds to a first possibly mutilated code word, a second corrupted version corresponds to the difference between a second possibly mutilated code word and a first estimate, obtained by decoding the difference between said first and said second possibly mutilated code words, and a third corrupted version corresponds to the difference between a third possibly mutilated code word, said first estimate and a second estimate, obtained by decoding the difference between said second and said third possibly mutilated code words.

According to still another aspect of the invention, the proposed solution could also be used in combination with the solutions described in the above-mentioned patent applications using a priori known information during decoding. A preferred way could be that, in a first step, the decoder tries to decode a possibly mutilated code word using a priori known information available on the address word embedded in said possibly mutilated code word. If this decoding fails or if the result is not reliable enough, then the present solution of joint decoding could be used. However, it is also possible that the present solution is always used in addition to the use of a priori known information during decoding.

BRIEF DESCRIPTION OF THE DRAWINGS

The invention will now be explained more in detail with reference to the drawings, in which.

DESCRIPTION OF THE PREFERRED EMBODIMENTS

Figure 1:
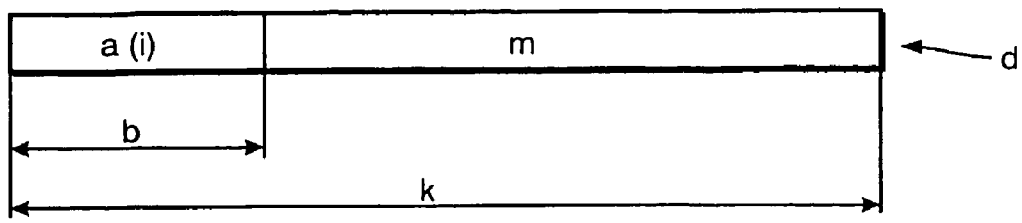
FIG. 1 shows the format of a data word information to be encoded.

In the following, it is assumed that information is represented as a k-bits string called data word d as shown in FIG. 1, said data word d comprising an address word $a(i)$ and an information word m. The address word $a(i)$ is a b-bits string representing the sector address for sector i; the information word m is a (k–b)-bits string containing any information to be stored, such as audio, video, software, copyright or date information or any other kind of data. It should be noted that the address word $a(i)$ is known if i is known and vice versa; however, knowledge of i does not give information on the information word m.

Figure 2:
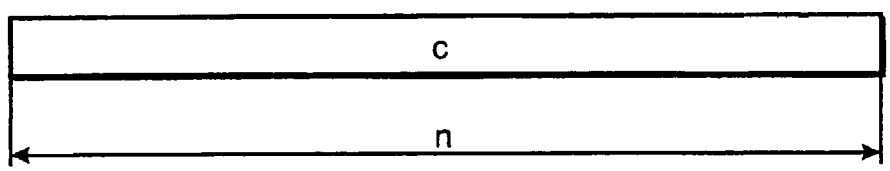
FIG. 2 shows the format of a code word.

The data word d shown in FIG. 1 is encoded using a k×n binary generator matrix G so that the data word $d=(a(i), m)$ is mapped on the n-bits code word $c(i, m)=(a(i), m)G$ as shown in FIG. 2.

Figure 3:
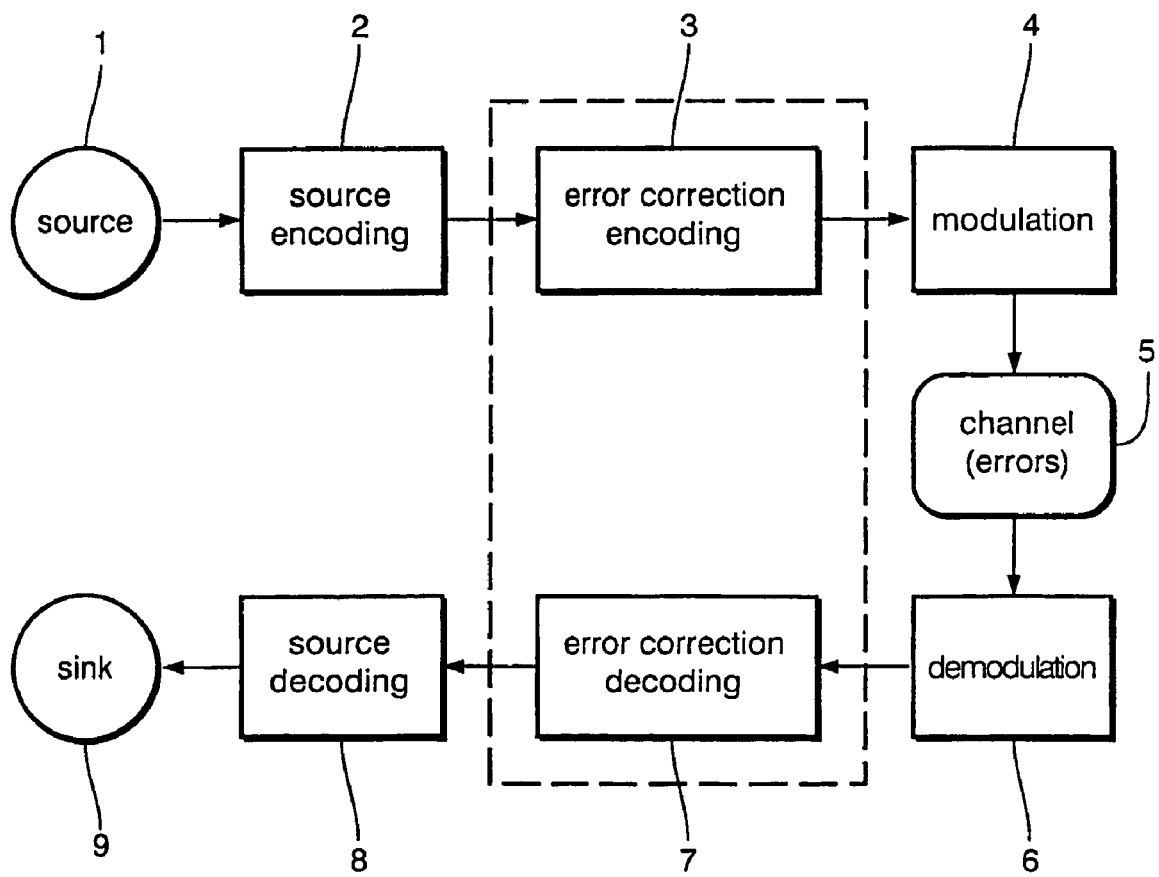
FIG. 3 shows a block diagram of an encoding and decoding scheme.

FIG. 3 shows a block diagram of a typical system using encoding and decoding. Therein user data, e.g., audio or video data, coming from a data source 1, e.g., recorded on a master tape or master disc, are encoded before they are stored on a data carrier, e.g., a disc, or transmitted over a transmission channel, e.g., over the Internet, before they are again decoded for forwarding them to a data sink 9, e.g., for replaying them.

The user data of the source 1 are first encoded by a source encoder 2, then error correction encoded by an ECC encoder 3, and thereafter modulated by a modulator 4, e.g., an EFM modulator, before the encoded user data—the code words—are put on the channel 5 on which errors may be introduced into the code words. The term "channel" 5 is here interpreted broadly, and includes a transmission channel as well as storage of the encoded data on a data carrier for a later replay.

When replay of data is intended, the encoded data first have to be demodulated by a demodulator 6, e.g., an EFM demodulator, before they are error correction decoded by an ECC decoder 7 and source decoded by a source decoder 8. Finally, the decoded user data can be input to the sink 9, e.g., a player device for replay of the user data.

Figure 4:
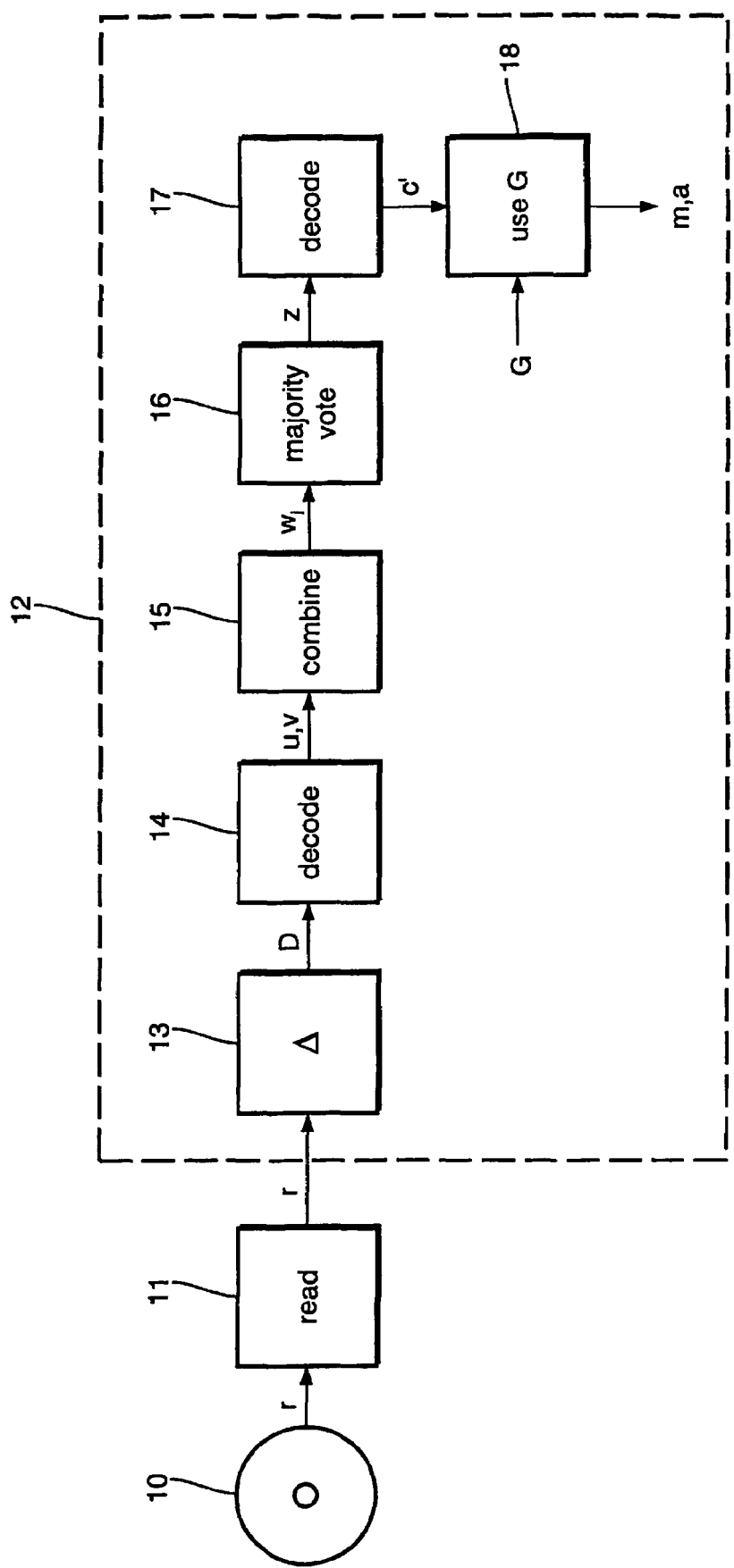
FIG. 4 shows a block diagram of the method of decoding according to the present invention.

The method of decoding according to the present invention shall be explained more in detail with reference to FIG. 4. It shall be assumed that data stored in encoded form on the record carrier 10 shall be replayed. In a first step, an amount of data r are read by a reading unit 11 and forwarded to an encoding apparatus 12. During its way from the encoder to the decoder, errors might be introduced into code words, e.g., by scratches on an optical record carrier or by transmission errors, so that the read code words r are possibly mutilated. Those errors shall be corrected by the decoder 12.

At first, the difference D of code words situated in consecutive sectors (or located consecutively in a transmitted data stream) is computed in unit 13. The difference D of code words $r_i$ and $r_{i+1}$ in the sectors i and i+1 is computed as follows:

$$c(i, m_1) \oplus c(i+1, m_2) = (\Delta(i), m_1 \oplus m_2)G,$$

wherein $\Delta(i) = a(i) \oplus a(i+1)$ for $0 \leq i \leq 2^b - 2$. The key observation is that for appropriate choices of the address word a, much can be said of the difference $\Delta(i)$ of two consecutive address words. It should be noted that $\oplus$ indicates a modulo –2 operation in which additions and subtractions have the same result.

Assuming that corrupted versions $r_1, r_2, r_3$ of L=3 consecutive code words $c_1, c_2, c_3$ are read, one can write for j=1, 2, 3:

$$r_j = c(i+j-1, m_j) \oplus e_j = (a(i), m_j)G \oplus e_j,$$

$e_j$ representing an error vector. It is clear that $$D_{12} = r_1 \oplus r_2 = (a(i), m_1)G \oplus (a(i+1), m_2)G \oplus (e_1 \oplus e_2) = (\Delta(i), m_1 m_2)G \oplus (e_1 \oplus e_2), \text{ and}$$

$$D_{23} = r_2 \oplus r_3 = (\Delta(i+1), m_2 \oplus m_3)G \oplus (e_2 \oplus e_3).$$

These L–1=2 differences $D_{12}$ and $D_{23}$ are computed by unit 13 and inputted into the first decoding unit 14.

In the decoding unit 14, said differences $D_{12}$, $D_{23}$ are decoded each to the closest code word from a subcode C' which consists of all possible differences of two consecutive code words c of the main code C. This could, e.g., be done by comparing the differences $D_{12}$, $D_{23}$ with all possible code words of the subcode C' and by selecting the closest code word as estimate u for $c(i, m_1) \oplus c(i+1, m_2)$ and as estimate v for $c(i+1, m_2) \oplus c(i+2, m_3)$. Thus, in the first decoding unit 14, estimates u, v for the differences of the pairs of code words $c_1 \oplus c_2$ and $c_2 \oplus c_3$, corresponding to the pairs of possibly mutilated code words $r_1 \oplus r_2$ and $r_2 \oplus r_3$, are obtained.

These estimates u, v are combined in unit 15 by computing $$w_1 := r_1 = c(i, m_1) \oplus e_1$$

$$w_2 := r_2 \oplus u = r_1 \oplus (r_1 \oplus r_2 \oplus u)$$

$$w_3 := r_3 \oplus u \oplus v = r_1 \oplus (r_1 \oplus r_2 \oplus u) \oplus (r_2 \oplus r_3 \oplus v).$$

If the estimate u is correct, then $r_1 \oplus r_2 \oplus u = e_1 \oplus e_2$. Similarly, if v is correct, then $r_2 \oplus r_3 \oplus v = e_2 \oplus e_3$. Hence, if the estimates u and v both are correct, then $$w_1 = c(i, m_1) \oplus e_1$$

$$w_2 = c(i, m_1) \oplus e_2$$

$$w_3 = c(i, m_1) \oplus e_3.$$

In combining unit 15, a number L=3 of corrupted versions $w_1$, $w_2$, $w_3$ of the particular code word $c_1 = c(i, m_1)$ are thus obtained.

Next, in unit 16, the code vector z is constructed by component-wise majority voting of the corrupted versions $w_1$, $w_2$, $W_3$ of the code word $c_1$. That is, for each $i \in \{1, 2, \ldots, n\}$, the i-th component $Z_i$ of the code vector z is an erasure, if $w_{1i}$, $w_{2i}$ and $W_{3i}$ are distinct; otherwise, the component $z_i$ equals the most frequent element among $w_{1i}$, $w_{2i}$, $w_{3i}$. The code vector z is then decoded by a second decoding unit 17 for the code C, the second decoding unit 17 decoding the code vector z into a code word c' of said code C. Finally, in unit 18, the generator matrix G, which had been used by the encoder to encode the address words and the information words into code words, is used to finally retrieve the information word m and the address word a embedded in said code word c'.

In general, a number of corrupted versions of L consecutive code words are read, say $r_j = c(i+j-1, m_j) \oplus e_j$ for j=1, 2, ..., L. Estimates for the differences of each of the (L−1) pairs of consecutive code words are obtained. By combining these estimates, L corrupted versions $w_1, w_2, \ldots, w_L$ of the code word $c_1 = c(i, m_1)$ are obtained. If all the estimates are correct, then it holds $w_j = c(i, m_1) \oplus e_j$ for j=1, 2, ..., L. The code vector z is obtained as the majority vote of $w_1, \ldots, w_L$ in each of the coordinates. If, in a certain coordinate, more than one symbol occurs most frequent, this coordinate in the code vector z is erased. Finally, the code vector z is decoded to a code word in the code C.

For reducing decoding delay, it is advantageous if the number L is as small as possible. With L=2, the described method is not appropriate, as majority voting on two alternatives is not useful. If reliability information, also known as soft decision information, is available on the bits of the possibly mutilated code words $r_1$ and $r_2$, reliability information for each of the bits of $w_2 := r_2 \oplus u$ can be obtained according to a well-known method. The code vector z can now, instead from majority voting, be obtained by setting the coordinates $z_i$ to the most reliable of the bits from $r_{1i}$ and $w_{2i}$. For enhancing the decoding of the code vector z, reliability information could be included for each of the bits of the code vector z. The reliability information for bit i in z is obtained by combining the reliability information of the bits $r_{1i}$ and $w_{2i}$.

Next, two special cases shall be briefly discussed. In a first special case, it is considered that the information word a(i) is the conventional k-bits binary representation of the integer i. For example, if k=8, then a(57)=00111001, as $57 = 0 \cdot 2^7 + 0 \cdot 2^6 + 1 \cdot 2^5 + 1 \cdot 2^4 + 1 \cdot 2^3 + 0 \cdot 2^2 + 0 \cdot 2^1 + 1 \cdot 2^0$. The binary representation of two consecutive integers nearly always has the same leftmost bit; the only exception is the address 011 . . . 1 that has 10 . . . 0 as a successor. Therefore, it can be assumed, with only a very small probability of being wrong, that the leftmost bit of the difference of two consecutive address words $\Delta(i) := a(i) \oplus a(i+1)$ equals zero. More generally, it will be shown that it is very likely that $\Delta(i)$ starts with many zeros. In other words, a solution as proposed in the above mentioned European patent applications EP 01201841.2 and EP 01203147.2 of using a priori known information in the decoder, can be applied since it is known that a lot of the leftmost information bits of $\Delta(i)$ are (with a high probability) equal to zero.

Let i be an integer between 0 and $2^{b-2}$. Let j be the number of ones in which (a)i ends, and further $0 \leq j \leq b-1$. One can write $(a)i = s01^j$, where s has length $b-j-1$, and $1^j$ denotes a string of j ones. It can be easily gathered that $a(i+1) = s10^j$, and $\Delta(i) = a(i+1) \oplus a(i) = 0^{b-j-1} 1^{j+1}$.

The following conclusions can be drawn:

a) for each $i \in \{0, 1, \ldots, 2^b-2\}$, $\Delta(i)$ is of the form $0^{b-m} 1^m$ for some $m \in \{1, 2, \ldots, b\}$.

b) $\Delta(i) = 0^{b-m} 1^m$ if and only if a(i) ends in (m−1) ones.

From conclusion b), it follows that the number of integers i for which $\Delta(i)$ starts with b−m zeros and ends in m ones equals 2b−m. Stated differently, for $m \geq 1$, the fraction of integers $i \in \{0, 1, \ldots, 2^b-2\}$ for which $\Delta(i)$ ends in exactly m ones equals $2^{b-m}/(2^b-1) \approx (1/2)^m$.

For example, the fraction of integers i for which $\Delta(i)$ ends in, at most, 4 ones approximately equals $1/2 + 1/4 + 1/8 + 1/16 = 15/16 = 0.9375$. That is, if it is assumed that $\Delta(i)$ starts with b−4 zeros, one is correct in nearly 94% of the cases. If it is assumed that $\Delta(i)$ starts with b−8 zeros, the minimum Hamming distance drops when the idea of using a prior known information symbols in the decoder, but the assumption is correct with a much larger probability of $255/256 \approx 0.9961$.

After decoding a corrupted version of $(\Delta(i), m_1 \oplus m_2)G$, i.e., after decoding the difference $D_{12}$, it should be checked if the purported value for $\Delta(i)$ is of the form $0^{n-m} 1^m$ for some $m \geq 1$. If not, the decoding result should be rejected. This extra check greatly reduces the probability of incorrect decoding, e.g., copyright information. According to another special case all sectors have the same information word m. The difference between the code words for the sectors i and i+1 can be computed as follows $$c(i, m) \oplus c(i+1, m) = (\Delta(i), 0)G.$$

In other words, the difference of any two consecutive code words is in the code $C_A$, defined as $$C_A = \{(\Delta(i), 0)G | 0 \leq i \leq 2^b-2\}.$$

The difference of corrupted versions of two consecutive code words can therefore be decoded to the code $C_A$. The code $C_A$, which is a subcode of the main code C, has small cardinality if the set of difference vectors $\{\Delta(i) | 0 \leq i \leq 2^b-2\}$ has small cardinality, and in that case, its minimum distance may well exceed the minimum distance of the code C.

In the special case that the address word a(i) is the conventional binary representation of i, it holds $$C_A = \{(0^i, 1^{b-i}, 0^{k-b})G | 0 \leq i \leq b-1\}.$$

Consequently, the subcode $C_A$ only contains b words, but not $2^b-1$ words, and optimal decoding can easily be performed by comparing the difference of two consecutive possibly mutilated words r with all b words from the subcode $C_A$. It should be noted that the number of comparisons to be made is linear, not exponential, in b.

Since $\Delta(i)$ does not usually end in many ones, it might be considered to decode to an even smaller subcode, namely $$C'_A = \{(0^i, 1^{b-i}, 0^{k-b})G | b' \leq i \leq b-1\}$$

where b' is an integer between 0 and b−1. The larger b', the smaller $C'_A$, but also the smaller the likelihood of correct decoding.

Also in case that the address representation a corresponds to binary Gray encoding, the subcode $C_A$ only has b elements. This is because, by definition, binary Gray encoding means that two consecutive addresses only differ in one position, that is, for each i, $\Delta(i)$ consists of one 1 and b−1 zeros.

The present invention constitutes an effective and reliable method for retrieving information stored in code words situated in several consecutive sectors or transmitted subsequently in a data stream. It employs certain relationships between consecutive code words and jointly decodes several such consecutive code words. The present solution can be applied in any encoding and decoding system where address words having a known relationship are assigned to consecutive code words.

The invention claimed is:

1. A method of decoding possibly mutilated code words (r) of a code (C), wherein an information word (m) and an address word (a) are encoded into a code word (c) of said code (c) using a generator matrix (G) and wherein said address words (a) are selected such that address words (a) having a predetermined relationship are assigned to consecutive code words (c), said method comprising the steps of:
   decoding differences (D) of at least two (L−1) pairs of possibly mutilated code words ($r_i$, $r_{i+1}$) to obtain estimates (u, v) for the differences of the corresponding pairs of code words ($c_i$, $c_{i+1}$);
   combining said estimates (u, v) to obtain a number (L) of at least two corrupted versions ($w_j$) of a particular code word (c);
   forming a code vector (z) from said number (L) of corrupted versions ($w_j$) of said particular code word (c) in each coordinate;
   decoding said code vector (z) to obtain a decoded code word (c') in said code (C); and
   using said generator matrix (G) to obtain the information word (m) and the address word (a) embedded in said decoded code word (c').

2. The method as claimed in claim 1, wherein the step of forming said code vector (z) is performed by majority voting.

3. The method as claimed in claim 2, wherein in the step of forming said code vector (z), a coordinate of said code vector (z) is erased if more than one value occurs most frequent among said number (L) of corrupted versions ($w_j$) of said particular code word (c).

4. The method as claimed in claim 1, wherein in the step of forming said code vector (z), reliability information, available on the symbols of one or more possibly mutilated code words (r), is used for selecting the coordinates of said code vector (z).

5. The method as claimed in claim 1, wherein in the step of decoding the differences (D) of at least two (L−1) pairs of possibly mutilated code words (r), the difference of a pair of possibly mutilated code words ($r_i$, $r_{i+1}$) is decoded to the closest code word from a subcode (C') consisting of all possible differences of two consecutive code words (c) of the code (C), said closest code word being used as an estimate (u).

6. The method as claimed in claim 1, wherein said method further comprises, after the step of decoding the differences (D) of at least two (L−1) pairs of possibly mutilated code words (r) to obtain said estimates (u, v), a step of:
   checking if said estimates (u, v) show a predetermined form and/or have a possible value.

7. The method as claimed in claim 1, wherein said address words (a) assigned to consecutive code words (c) are consecutive sector addresses of sectors of an information carrier storing said code words (c).

8. The method as claimed in claim 1, wherein in said step of decoding the differences (D) of a at least two (L−1) pairs of possibly mutilated code words (r), at least two pairs of two consecutive possibly mutilated code words (r) are decoded.

9. A method of decoding possibly mutilated code words (r) of a code (C), wherein an information word (m) and an address word (a) are encoded into a code word (c) of said code (C) using a generator matrix (G) and wherein said address words (a) are selected such that address words (a) having a predetermined relationship are assigned to consecutive code words (c), said method comprising the steps of:
   decoding differences (D) of a number (L−1) of pairs of possibly mutilated code words ($r_i$, $r_{i+1}$) to obtain estimates (u, v) for the differences of the corresponding pairs of code words ($c_i$, $c_{i+1}$);
   combining said estimates (u, v) to obtain a number (L) of at least two corrupted versions ($w_j$) of a particular code word (c);
   forming a code vector (z) from said number (L) of corrupted versions ($w_j$) of said particular code word (c) in each coordinate;
   decoding said code vector (z) to obtain a decoded code word (c') in said code (C); and
   using said generator matrix (G) to obtain the information word (m) and the address word (a) embedded in said decoded code word (c'),
wherein, in said step of combining said estimates (u, v) to obtain an number (L) of corrupted versions ($w_j$) of a particular code word (c), a first corrupted version ($w_1$) corresponds to a first possibly mutilated code word ($r_1$), a second corrupted version ($w_2$) corresponds to the difference between a second possibly mutilated code word ($r_2$) and a first estimate (u), obtained by decoding the difference between said first and said second possibly mutilated code words ($r_1$, $r_2$), and a third corrupted version ($w_3$) corresponds to the difference between a third possibly mutilated code word ($r_3$), said first estimate (u) and a second estimate (v), obtained by decoding the difference between said second and said third possibly mutilated code words ($r_2$, $r_3$).

10. The method as claimed in claim 1, wherein said method further comprises a step of;

using a priori known information of address word (a) embedded in said possibly mutilated code word (r) to decode said code word (r) before decoding the differences (D) of at least two (L−1) pairs of possibly mutilated code words (r).

11. An apparatus for decoding possibly mutilated code words (r) of a code (C), wherein an information word (m) and an address word (a) are encoded into a code word (c) of said code (C) using a generator matrix (G) and wherein said address words (a) are selected such that address words (a) having a predetermined relationship are assigned to consecutive code words (c), said apparatus comprising:

first decoding means for decoding differences (D) of at least two (L−1) pairs of possibly mutilated code words ($r_i$, $r_{i+1}$) to obtain estimates (u, v) for the differences of the corresponding pairs of code words ($c_i$, $c_{i+1}$);

combining means for combining said estimates (u, v) to obtain a number (L) of at least two corrupted versions ($w_j$) of a particular code word (c);

forming means for forming a code vector (z) from said number (L) of corrupted versions ($w_j$) of said particular code word (c) in each coordinate;

second decoding means for decoding said code vector (z) to obtain a decoded code word (c') in said code (C); and use means for using said generator matrix (G) to obtain the information word (m) and the address word (a) embedded in said decoded code word (c').

12. A computer readable medium containing a computer program comprising computer program code means for causing a computer to perform the steps of the method as claimed in claim 1 when said computer program is run on said computer.

* * * * *